United States Patent [19]

Flamm

[11] Patent Number: 4,607,278
[45] Date of Patent: Aug. 19, 1986

[54] DIGITAL CIRCUIT FOR SUPPRESSING CHANGES IN A DIGITAL SIGNAL

[75] Inventor: Peter M. Flamm, Freiburg, Fed. Rep. of Germany

[73] Assignee: ITT Industries, Inc., New York, N.Y.

[21] Appl. No.: 536,291

[22] Filed: Sep. 27, 1983

[30] Foreign Application Priority Data

Oct. 9, 1982 [EP] European Pat. Off. ........ 82710049.6

[51] Int. Cl.[4] .............................................. H04N 9/64
[52] U.S. Cl. ...................................... 358/36; 328/165; 375/99; 375/103; 358/37; 358/166; 358/167
[58] Field of Search ................... 358/36, 37, 166, 167; 307/542, 543, 358, 555, 573; 328/116, 165; 375/99, 103

[56] References Cited

U.S. PATENT DOCUMENTS 4,470,017 9/1984 Eder .................................... 307/542

Primary Examiner—Michael A. Masinick
Attorney, Agent, or Firm—Donald J. Lenkszus

[57] ABSTRACT

A digital circuit is described for the clocked suppression of changes in a multidigit, positive or negative digital signal which have signs opposite to those of signal changes at previous instants of a clock signal.

8 Claims, 4 Drawing Figures

4,607,278

DIGITAL CIRCUIT FOR SUPPRESSING CHANGES IN A DIGITAL SIGNAL

BACKGROUND OF THE INVENTION

This invention pertains to digital signal processing circuits in general. In particular, the present invention relates to a digital circuit for the clocked suppression of changes in a multidigit, positive or negative digital signal which have signs opposite to those of signal changes at previous instants of a clock signal.

During the processing of digital signals derived from analog signals, e.g., by means of analog-to-digital converters, disturbances superimposed on the analog signals, e.g., on the transmission path or during analog signal processing, are frequently just as disadvantageous as during the processing of the analog signals. Therefore, there is a general need for digital circuits with which such unwanted signals can be eliminated.

SUMMARY OF THE INVENTION

Accordingly, it is one object of the invention to provide a digital circuit with which the aforementioned disturbances can be eliminated.

In accordance with the principles of the invention, as far as changes in the individual bits of the digital signal are concerned, disturbances superimposed on the digital signal behave just as changes in the ideal digital signal. Further in accordance with the principles of the invention, the unwanted signals can be suppressed if those changes in the digital signal whose signs are opposite to those of signal changes at previous instances of the clock signal are suppressed.

In accordance with the invention, for the clocked suppression of multidigitsignal changes whose signs are opposite to those of signal changes at previous instants of a clock signal, and thus for supporting noise in digital signals occurring in color-television sets with digital signal processing circuitry, parallel signal processing is employed. The digital signal is applied to a first delay element providing a delay equal to the period of the clock signal, and to the subtrahend input of a first subtracter. The output of the first delay element is connected to the minuend input of the first subtracter and to the first input of a first adder. The output of the first subtracter is coupled to the input of a symmetrically limiting accumulator. The output of the accumulator is connected to the second input of the first adder and the accumulator's range of accumulation is equal to the range of values of the changes to be suppressed.

BRIEF DESCRIPTION OF THE DRAWINGS

The invention will be better understood from a reading of the following detailed description with reference to the accompanying drawings, in which.

DETAILED DESCRIPTION

Figure 1:
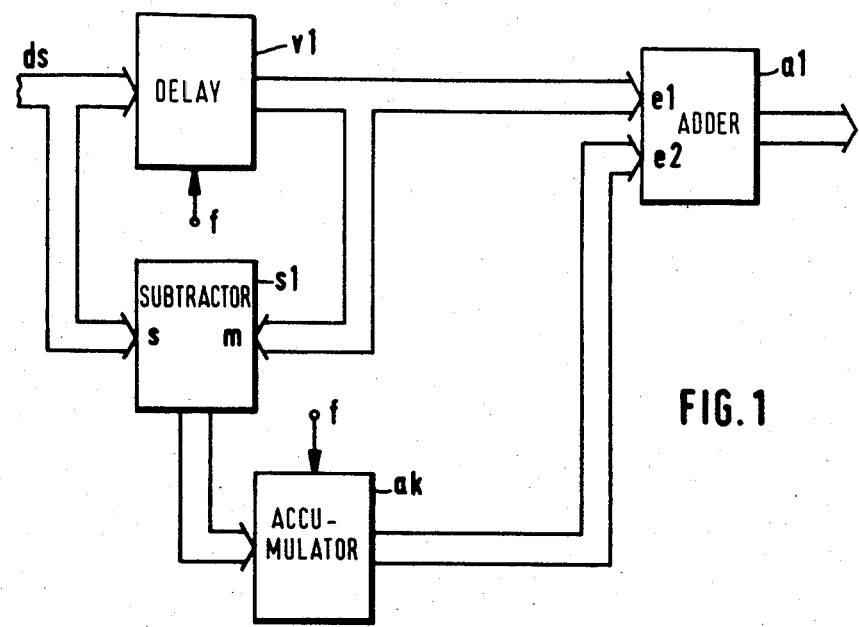
FIG. 1 is a block diagram of an embodiment of the invention.

The block diagram of FIG. 1 shows an embodiment of the invention. As indicated by the stripelike interconnecting leads, also commonly referred to as "busses", the digital circuit is designed for parallel signal processing. Therefore, the below-mentioned inputs and outputs of the individual subcircuits are parallel inputs and outputs. The digital signal ds is applied to the subtrahend input s of the first subtractor s1 and to the input of the first delay element v1, which has its output connected to the first input e1 of the first adder a1 and to the minuend input m of the first subtracter s1. The delay provided by the first delay element v1 is equal to the period of the clock signal f. The output of the first subtracter s1 is connected to the input of the symmetrically limiting accumulator ak, which, like the first delay element v1, is fed with the clock signal f. The accumulator ak sums the digital signals appearing at the output of the first subtractor s1 up to the upper and lower limiting values, where it stops, so to speak, if further input signals with the same sign appear. To this end, it consists, for example, of a further adder followed by a buffer memory or register whose output is connected to the other input of the further adder via a suitable limiter. At any instant of the clock signal f, a new signal value, namely that at the output of the first subtracter s1, is thus added to the digital signal in the register.

The output of the accumulator ak is connected to the corresponding low-order terminals of the second input e2 of the first adder a1. The range of accumulation of the accumulator ak, i.e., the range between the positive and the negative limiting value, is equal to the range of values of the digital signal changes to be suppressed. The compensated digital signal can be taken from the output of the first adder a1.

In operation, the first delay element v1 delays the digital signal ds by one period of the clock signal f, so that the difference between these two signals can be formed by means of the first subtracter s1. This difference is summed up in the accumulator ak, and the accumulated value is limited to the positive or negative limiting value if necessary. By means of the first adder a1, the output signal from the accumulator ak is then added, with the proper sign, to the digital signal from the first delay element v1. In this manner, changes in the digital signal ds which are due to disturbances are suppressed.

Figure 2:
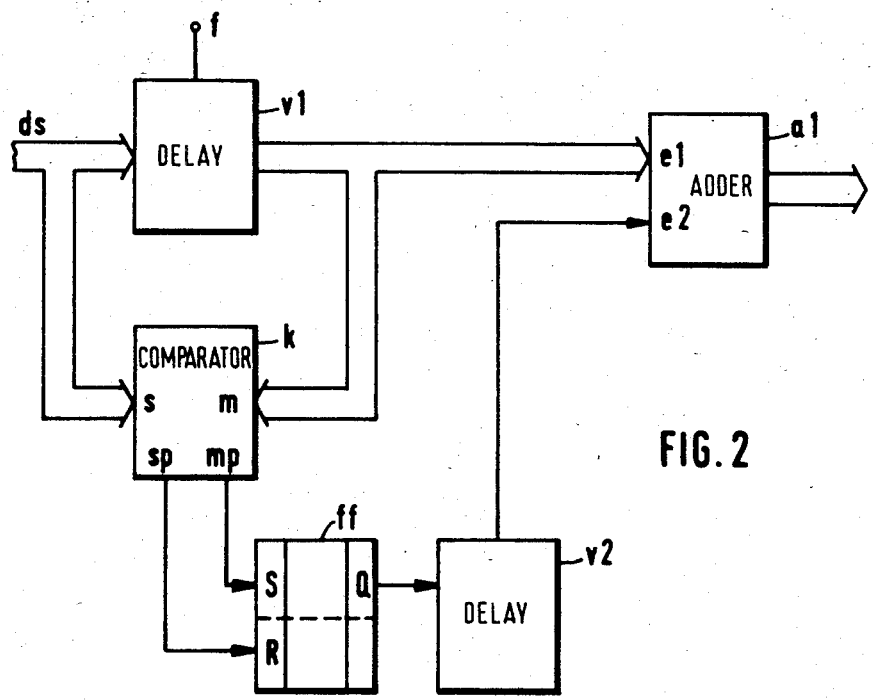
FIG. 2 is a block diagram of a modification of the arrangement of FIG. 1 for suppressing changes in the least significant bit of the digital signal.

FIG. 2 shows a modification of the arrangement of FIG. 1 which is advantageous if only changes in the least significant bit of the digital signal ds must be compensated for, and if the positive values of the digital signal are present in the binary code, while its negative values are present in the binary two's complement. For this case, the first subtracter s1 of FIG. 1 is designed as a comparator k whose minuend-greater-than-subtrahend output mp is connected to the S input of the RS flip-flop ff, while the subtrahend-greater-than-minuend output sp is connected to the R input of the flip-flop. The Q output of the flip-flop (in positive logic, this is the output which, when the S signal is at the more positive level, H, of two binary levels H, L, is at an H level, too) is thus connected to the input of the delay element v2, which is of the same design as the first delay element V1 and has its output connected to all terminals of the second input e2 of the first adder a1.

The arrangement of FIG. 2 works on the same fundamental principle as that of FIG. 1, but in the special case of FIG. 2, advantage can be taken of the fact that, if positive and negative numbers are coded in the binary code and the binary two's complement, respectively, decimal −1 occurs as a digital signal consisting only of ones. If, therefore, the output of the second delay element v2 is connected to all terminals of the second input e2 of the first adder e1 in FIG. 2, the sum of the delayed digital signal ds and −1 will be formed in the first adder a1 when the output of the second delay element v2 is a 1, while the delayed digital signal ds will be left unchanged when the output of the second delay element v2 is a 0.

Figure 3:
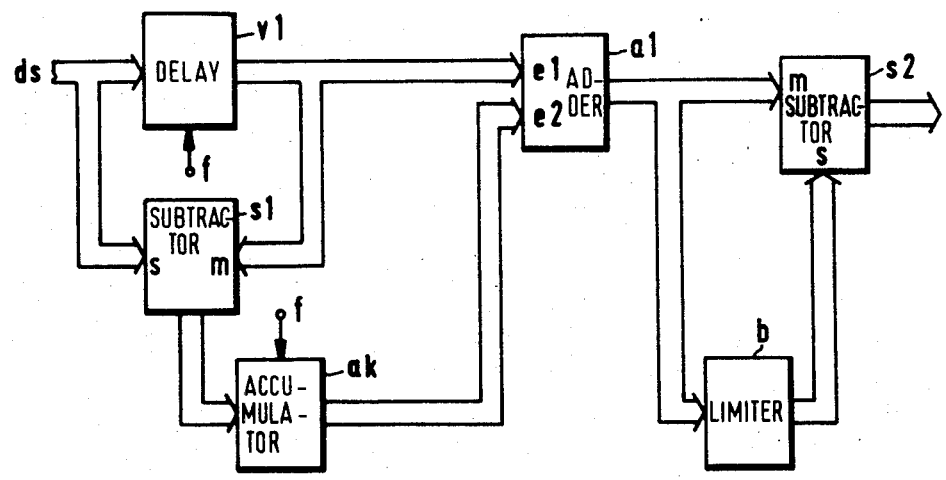
FIG. 3 shows an improvement on the arrangement of FIG. 1.

FIG. 3 shows an improvement on the arrangement of FIG. 1. This circuit makes it possible to compensate for the fact that the output of the first adder a1 of FIG. 1 provide signals dependent on the direction of change in the digital signal ds. This means that the compensation for a negatively directed change gives an output signal different from that resulting from the compensation for a positively directed change.

In addition to the stages corresponding to those of the arrangement of FIG. 1, the arrangement of FIG. 3 contains the limiter b, which is connected to the output of the first adder a1, and the second subtracter s2, whose minuend input m, too, is connected to the output of the first adder a1, and whose subtrahend input s is connected to the output of the limiter b. The limiter b has a pass range which is equal to the range of values of the digital signal changes to be suppressed.

Figure 4:
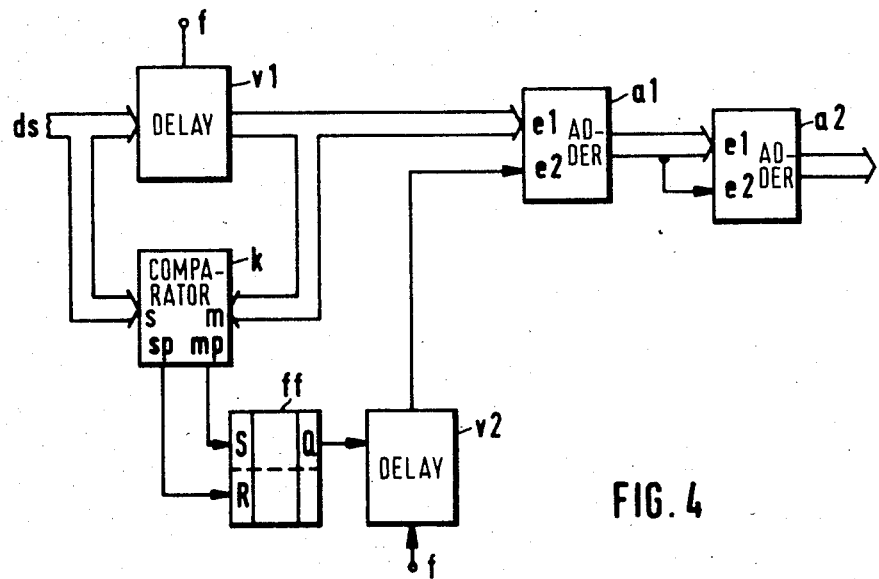
FIG. 4 shows a corresponding improvement on the arrangement of FIG. 2.

FIG. 4 shows a corresponding improvement of the modification of FIG. 2. In this case, the limiter b of FIG. 3 can be dispensed with because recourse can be had to the properties of the binary code and the binary two's complement for negative numbers: the second subtracter s2 of FIG. 3 has been replaced in FIG. 4 with the second adder a2, and the least significant terminal of this adder's second input e2 is connected to the sign-bit terminal of the output of the first adder a1. Since in the aforementioned code the negative sign corresponds to a 1 in this sign position, a +1 is thus added to a negative signal at the first input e1 of the second adder a2, so that the negative range of values is shifted by 1 in the positive direction.

The following table serves to illustrate the operation of the digital circuit in accordance with the invention. It shows both the static and the dynamic behaviour of the circuit by giving corresponding decimal numerical values. In the case of the static values in the second and third columns, "or" indicates that these output values depend on the direction of change of the digital signal ds. It should be emphasized that at the value ds=0, two values appear at the output of the first adder a1, but only one value at the output of the adder a2, which is due to the above-described operation of this adder. In the dynamic case, this applies to the three middle values of the table.

In the dynamic data, the diagonal means that the two values assigned to it change to and fro.

TABLE

| ds | Output of a1 | Output of a2 |
|---|---|---|
| static | | |
| +2 | +1 or +2 | +1 or +2 |
| +1 | 0 or +1 | 0 or +1 |
| 0 | 0 or −1 | 0 |
| −1 | −1 or −2 | 0 or −1 |
| −2 | −2 or −3 | −1 or −2 |
| dynamic | | |
| +5/+6 | +5 | +5 |
| +2/0 | +1/0 | +1/0 |
| +1/0 | 0 | 0 |
| +1/−1 | 0/−1 | 0 |
| −1/0 | −1 | 0 |
| −2/0 | −2/−1 | −1/0 |
| −5/−6 | −6 | −5 |

The digital circuit in accordance with the invention can be advantageously implemented as an integrated circuit. Due to its small amount of circuitry, it can be used as a subcircuit of a large integrated circuit. A preferred application is in digital color-television sets as disclosed in Offenlegungsschrift DE No. 28 54 236 A1 for suppressing digital signal noise.

What is claimed is:

1. A digital circuit for the clocked suppression of changes in a multidigit, positive or negative digital signal which have signs opposite to those of signal changes at previous instants of a clock signal, said digital circuit providing parallel signal processing and comprising:
a first means for receiving said digital signal and for providing said digital signal at an output delayed in time by an amount equal to the period of said clock signal;
a first subtracter having a subtrahend input coupled to said first means output, a minuend input for receiving said digital signal and having an output;
a symmetrically limiting accumulator having an input coupled to said first subtracter output, said accumulator being clocked by said clock signal, and having a range of accumulation equal to the range of values of changes to be suppressed, and having an output;
a first adder having a first input coupled to said delay means, second inputs and an output;
said accumulator output being coupled to said first adder second inputs.

2. A digital circuit in accordance with claim 1, comprising:
a limiter having an input coupled to said first adder output, an output and having a pass range equal to the range of values of the changes to be suppressed;
a second subtracter having a minuend input coupled to said first adder output, a second input having low order terminals coupled to said limiter output, and an output.

3. A digital circuit in accordance with claim 1, wherein said digital signal has positive values represented in binary code and has negative values represented in binary two's compliment code,
wherein said changes are suppressed in the least significant bit of said digital signal; and
wherein said first subtracter comprises a comparator for generating a first output when said minuend input is greater than said subtrahend input and for generating a second output when said subtrahend input is greater than said minuend input, and an RS flip-flop having a set input coupled to said first output and a reset input coupled to said second output,
said RS flip-flop having an output and a second delay means having an input coupled to said RS flip-flop output, and having an output coupled to all of said first adder second input terminals, said second delay means delaying signals at said delay means input by an amount equal to said period.

4. A digital circuit in accordance with claim 3, comprising a second adder having a first input coupled to said first adder output a second input, and an output, the sign digit terminal of said first adder output being connected to the least significant terminal of said second adder second input.

5. A digital circuit in accordance with claim 1, used in a color television set with digital signal processing circuitry.

6. A digital circuit in accordance with claim 2, used in a color television set with digital signal processing circuitry.

7. A digital circuit in accordance with claim 3, used in a color television set with digital signal processing circuitry.

8. A digital circuit in accordance with claim 4, used in a color television set with digital signal processing circuitry.

* * * * *